United States Patent
Tojo et al.

(10) Patent No.: US 7,470,568 B2
(45) Date of Patent: *Dec. 30, 2008

(54) METHOD OF MANUFACTURING A SEMICONDUCTOR DEVICE

(75) Inventors: Shinji Tojo, Higashimurayama (JP); Shinya Kanamitsu, Mitaka (JP); Seiichi Ichihara, Hino (JP)

(73) Assignees: Renesas Technology Corporation, Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/882,199

(22) Filed: Jul. 31, 2007

(65) Prior Publication Data

US 2008/0032453 A1 Feb. 7, 2008

Related U.S. Application Data

(63) Continuation of application No. 10/754,545, filed on Jan. 12, 2004, now Pat. No. 7,262,083, which is a continuation of application No. 10/242,720, filed on Sep. 13, 2002, now Pat. No. 6,699,737.

(30) Foreign Application Priority Data

Oct. 9, 2001 (JP) ............................... 2001-311540

(51) Int. Cl.
*H01L 21/00* (2006.01)

(52) U.S. Cl. .................. 438/119; 438/107; 438/118; 438/125; 257/E21.449; 257/E21.51; 257/E21.516

(58) Field of Classification Search ......... 438/106–108, 438/110, 119, 611–613, 125, FOR. 364, FOR. 366, 438/FOR. 369; 257/E21.499, E21.503, E21.51, 257/E21.511, 666, 678, 690–692, 734, 735, 257/778, E21.516
See application file for complete search history.

(56) References Cited

U.S. PATENT DOCUMENTS

| 6,444,492 | B1 | 9/2002 | Ohta | 438/108 |
|---|---|---|---|---|
| 6,475,877 | B1 | 11/2002 | Saia et al. | 438/460 |
| 2001/0002066 | A1 | 5/2001 | Mita et al. | 257/693 |
| 2001/0019852 | A1 | 9/2001 | Hashimoto | 438/106 |
| 2001/0029062 | A1 | 10/2001 | Hashimoto | 438/110 |
| 2002/0013014 | A1 | 1/2002 | Jiang | 438/106 |
| 2002/0037605 | A1 | 3/2002 | Ninomiya et al. | 438/125 |
| 2002/0058358 | A1 | 5/2002 | Jiang | 438/118 |

FOREIGN PATENT DOCUMENTS

| JP | 2000-124255 | 4/2000 |
|---|---|---|
| JP | 2001-144144 | 5/2001 |

*Primary Examiner*—Michelle Estrada
*Assistant Examiner*—Quovaunda Jefferson
(74) *Attorney, Agent, or Firm*—Miles & Stockbridge P.C.

(57) ABSTRACT

Salient electrodes on a semiconductor chip and leads on a film substrate are to be connected together with a high accuracy. A change in lead pitch which occurs at the time of connecting salient electrodes on a semiconductor chip and inner leads on a film substrate with each other is taken into account and a correction is made beforehand to the pitch of the inner leads. Likewise, a change in lead pitch which occurs at the time of connecting electrodes on a liquid crystal substrate and outer leads on the film substrate with each other is taken into account and a correction is made beforehand to the pitch of the outer leads.

7 Claims, 13 Drawing Sheets

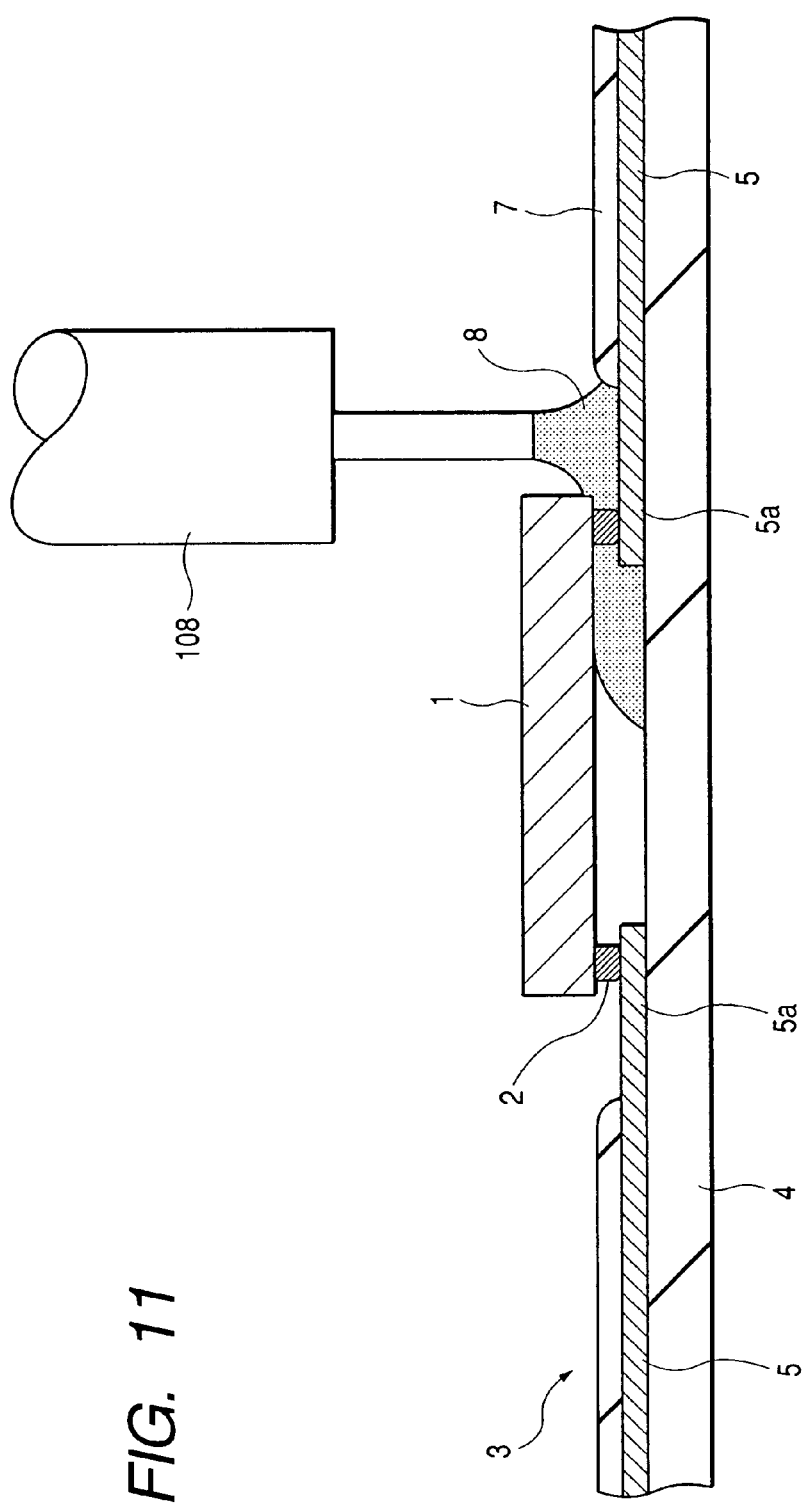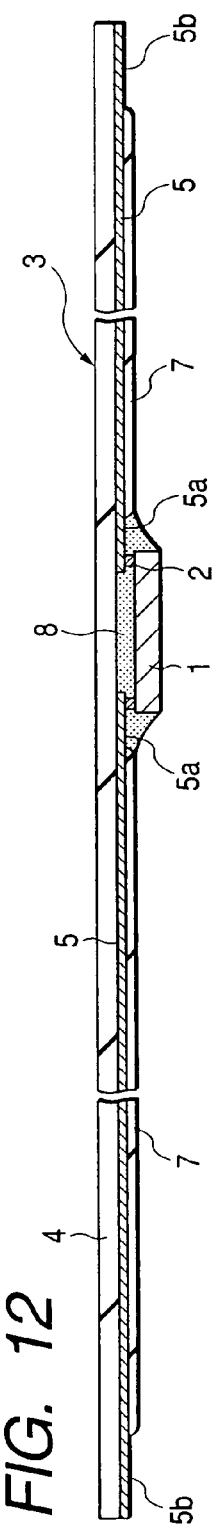

METHOD OF MANUFACTURING A SEMICONDUCTOR DEVICE

CROSS-REFERENCE TO RELATED APPLICATION

This application is a continuation of application Ser. No. 10/754,545 filed Jan. 12, 2004, now U.S. Pat. No. 7,262,083, which is a continuation of application Ser. No. 10/242,720 filed Sep. 13, 2002 (now U.S. Pat. No. 6,699,737 issued Mar. 2, 2004).

BACKGROUND OF THE INVENTION

The present invention relates to a semiconductor device manufacturing technique and more particularly to a technique applicable effectively to a semiconductor device wherein a semiconductor chip having salient electrodes is facedown-mounted to a flexible-film substrate.

In association with semiconductor devices wherein a semiconductor chip having salient electrodes such as Au bumps is facedown-mounted to a flexible film substrate there are known TAB (Tape Automated Bonding) and TCP (Tape Carrier Package).

The flexible substrate used in the aforesaid TAB or TCP generally comprises an insulating film formed by a polyimide resin for example and plural Cu leads formed on the surface of the insulating film. Therefore, it is known that there occur expansion and contraction of the insulating film due to moisture contained in the atmosphere and that an error of lead pitch results.

For example, in Japanese Published Unexamined Patent Application No. 2001-144144 it is pointed out that maintaining the humidity at 60% or so is important for preventing a change in lead pitch caused by expansion or contraction of an insulating film which is attributable to a change in humidity.

Japanese Published Unexamined Patent Application No. 2000-124255 discloses a technique of narrowing the lead pitch beforehand by the amount of an increase in lead pitch caused by expansion of an insulating film as a measure against the occurrence of an error in lead pitch which error results from expansion of the insulating film in the presence of moisture or heat contained in the atmosphere.

SUMMARY OF THE INVENTION

The present inventors are now developing a liquid crystal driver to be mounted on a liquid crystal substrate in a personal computer or a mobile communication terminal. This liquid crystal driver comprises a film substrate with Cu leads formed on the surface of an insulating film and a semiconductor chip for liquid crystal drive. The semiconductor chip is of a structure wherein it is connected to the leads of the film substrate through Au bumps.

In the step of mounting the semiconductor chip onto the film substrate, Au bumps of the semiconductor chip fixed onto a stage of a bonder and corresponding leads on the film substrate are aligned with each other, the semiconductor chip and the film substrate are sandwiched between a bonding tool heated to about 500° C. and the stage from both above and below, followed by the application of load, thereby bonding together all of the Au bumps formed on the semiconductor chip and the corresponding leads of the film substrate.

In the above step, when the Au bumps and the leads are bonded together, the portion of the insulating film located near the leads is exposed to a high temperature and expands thermally, with consequent change in lead pitch, thus giving rise to problems such as an open defect in which the leads and the Au bumps become out of contact and a short defect in which two adjacent Au bumps are brought into contact with each other through one lead.

Particularly, in a liquid crystal driver, the number of input and output terminals is as extremely large as 500 pins or so and consequently the lead width and pitch are extremely narrow, so that there easily occurs a defective connection between the leads and the Au bumps which is ascribable to a change in lead pitch.

It is an object of the present invention to provide a technique which permits a highly accurate connection between salient electrodes of a semiconductor chip and leads of a film substrate.

Other objects and novel features of the present invention will become apparent from the following description and the accompanying drawings.

A typical invention disclosed herein will be outlined below.

A method of manufacturing a semiconductor device, comprising the steps of (a) providing a semiconductor chip, the semiconductor chip having a plurality of salient electrodes formed by conductors containing gold, (b) providing a wiring substrate, the wiring substrate comprising a thin film base formed by an insulator containing an organic resin and a plurality of leads formed on the thin film base correspondingly to the plural salient electrodes, and (c) bonding the plural salient electrodes formed on the semiconductor chip respectively to the plural leads formed on the wiring substrate, wherein, in the wiring substrate provided in the above step (b), the pitch of the plural salient electrodes is larger than the pitch of the leads at the portions corresponding respectively to the plural salient electrodes, and the plural leads are fixed to the thin film base at their portions to be bonded to the salient electrodes.

BRIEF DESCRIPTION OF THE DRAWINGS

FIG. 11 is a schematic sectional view showing an underfill pouring step for the liquid crystal driver of the embodiment;

FIG. 12 is a sectional view showing a completed state of the liquid crystal driver of the embodiment;

DETAILED DESCRIPTION OF THE PREFERRED EMBODIMENT

Figure 1:
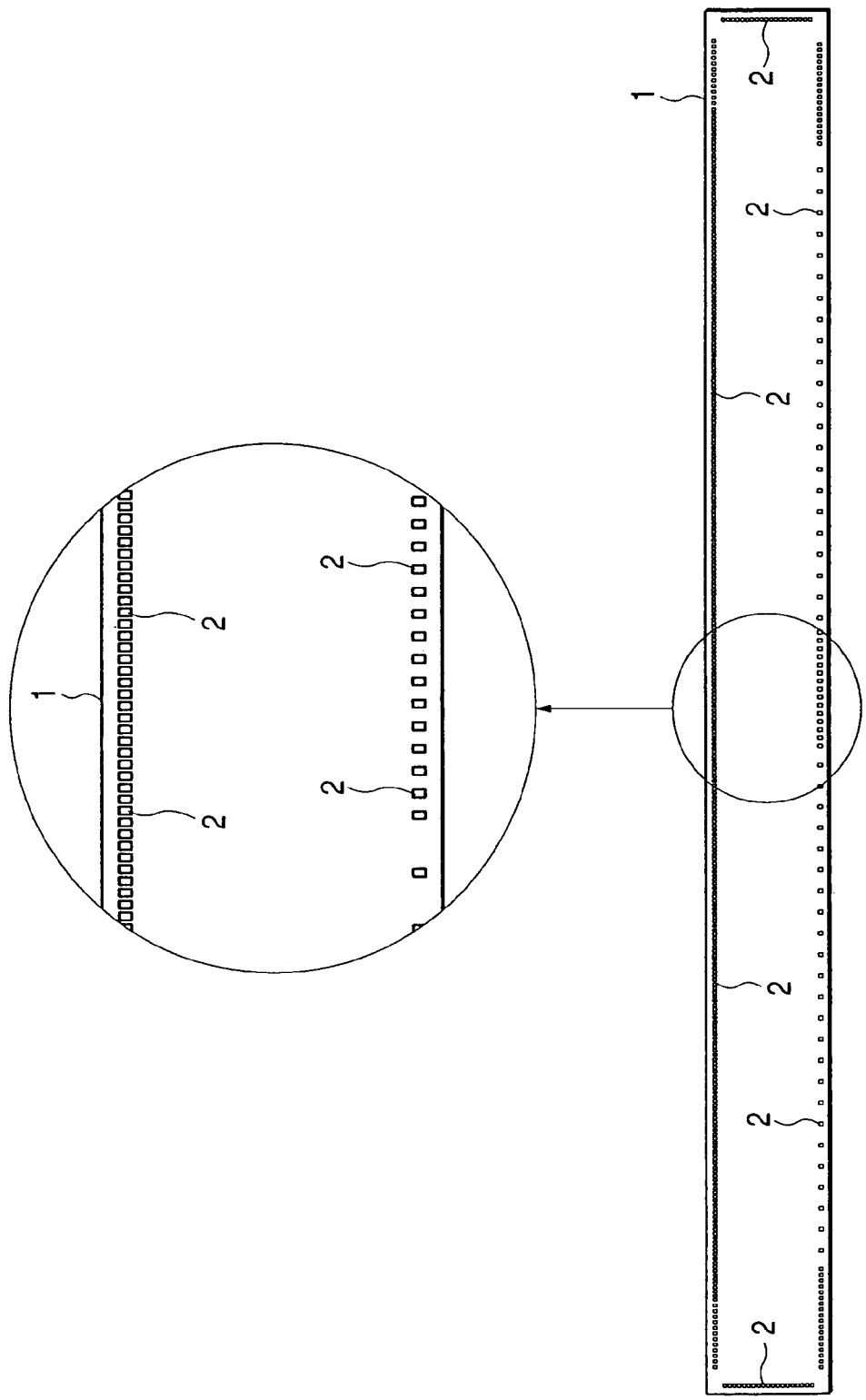
FIG. 1 is a plan view of a semiconductor chip mounted on a liquid crystal driver according to an embodiment of the present invention.

An embodiment of the present invention will be described in detail hereinunder with reference to the accompanying drawings. In all of the drawings for illustrating the embodiment, the same members are identified by the same reference numerals in principle and tautological explanations thereof will be omitted.

A semiconductor device of this embodiment is a liquid crystal driver of a chip-on-film (COF) structure composed of a film substrate serving as an interposer and a semiconductor chip mounted on the film substrate. For example, it is mounted on a liquid crystal substrate of a personal computer or a mobile communication terminal.

FIG. 1 is a plan view of a semiconductor chip (hereinafter referred to simply as "chip") 1 to be mounted on the liquid crystal driver of this embodiment.

The chip 1 is formed by a single crystal silicon substrate of 14.6 mm long by 1.32 wide. A liquid crystal drive circuit (not shown) is formed on a main surface of the chip 1. On a peripheral portion of the main surface of the chip 1 are formed in a line a total of 449 Au bumps (salient electrodes) 2 in both long- and short-side directions.

The Au bumps 2 are formed on input/output terminals (bonding pads) of the chip 1 by, for example, electrolytic plating, electroless plating, vapor deposition, or sputtering.

The chip 1 is fabricated by the steps of forming liquid crystal drive circuits and input/output terminals (bonding pads) in a large number of chip areas partitioned on a main surface of a semiconductor wafer, with use a known semiconductor fabricating technique, then forming Au bumps 2 on the input/output terminals by the foregoing method, and thereafter dicing the semiconductor wafer into individual chip areas.

Figure 2:
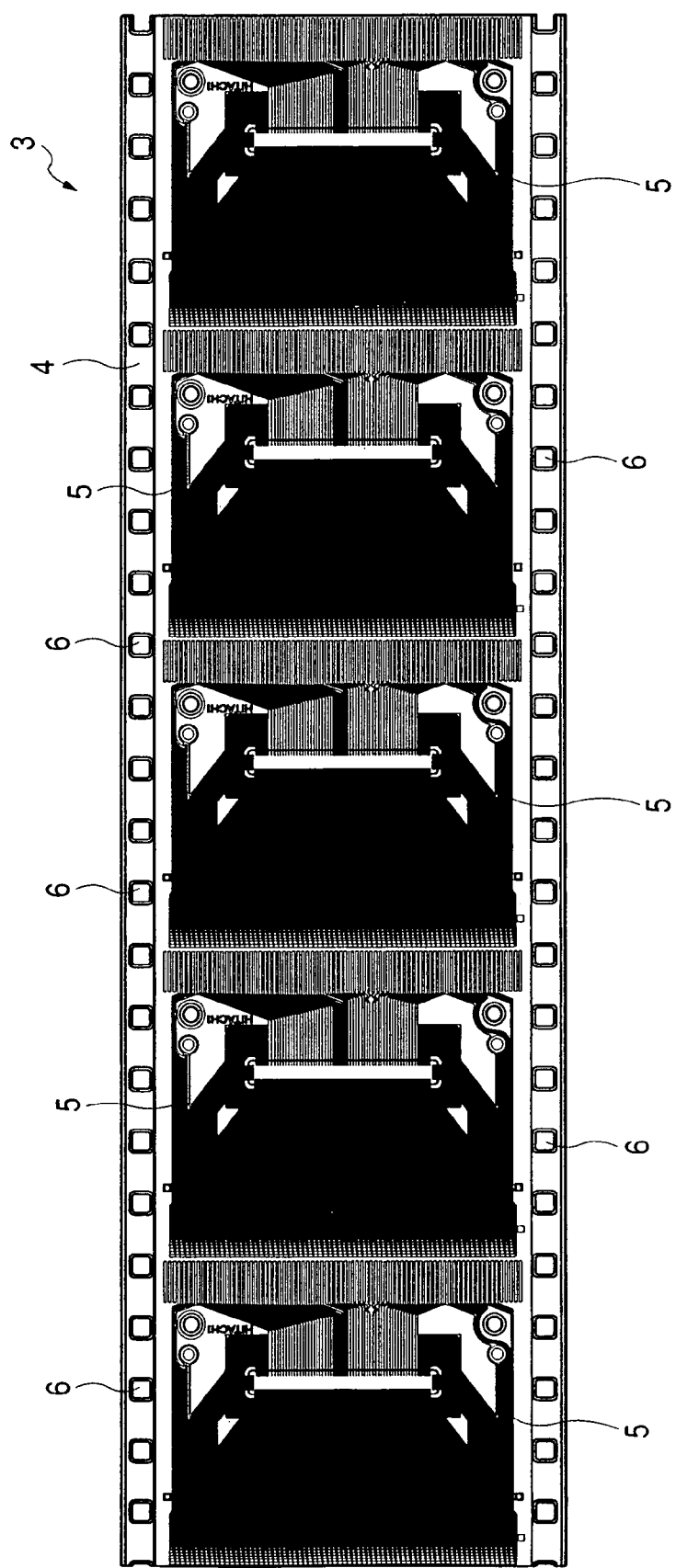
FIG. 2 is a plan view of a principal portion, showing a film substrate of the liquid crystal driver of the embodiment.
Figure 3:
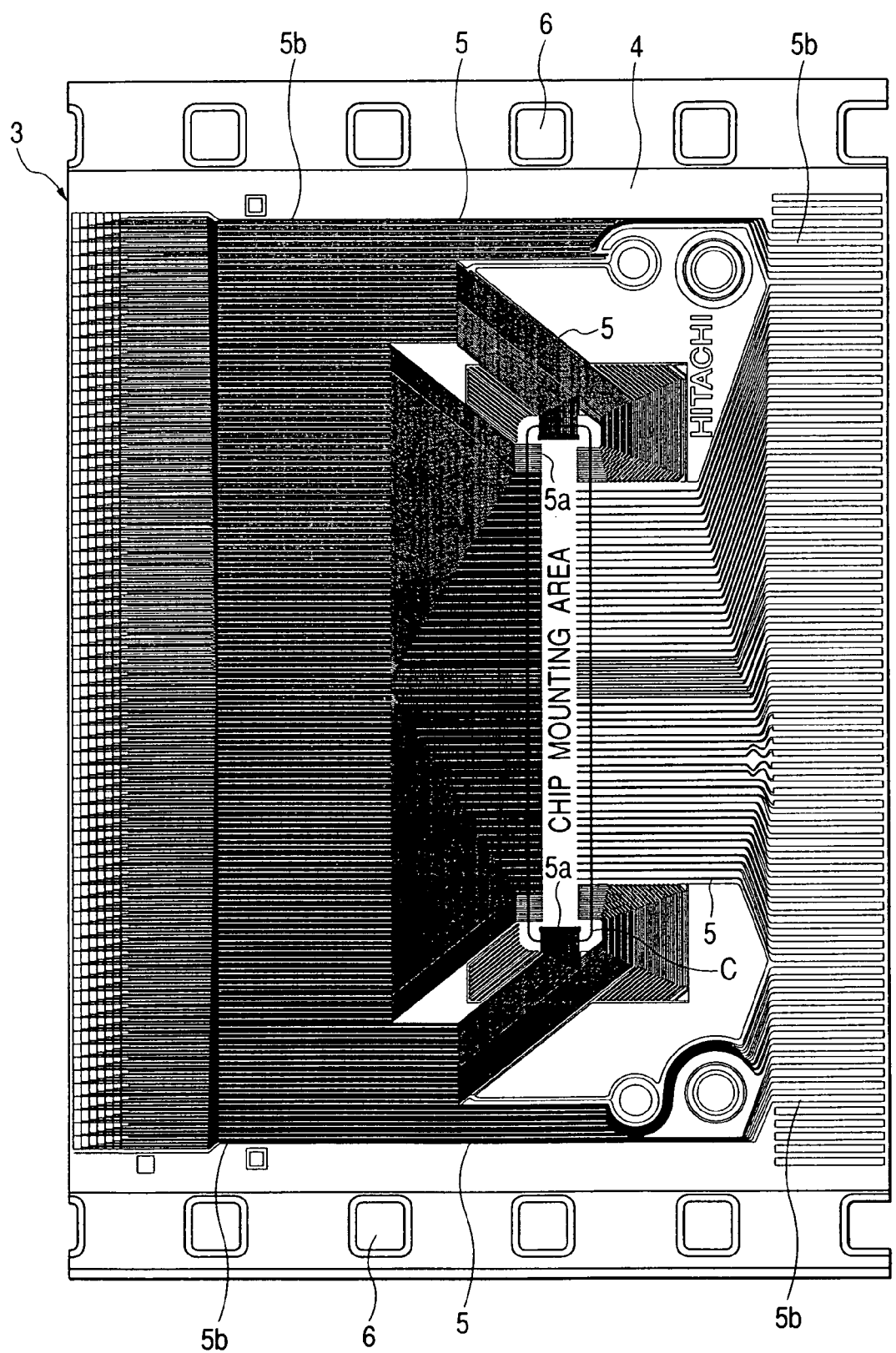
FIG. 3 is an enlarged plan view of the film substrate shown in FIG. 2.

FIG. 2 is a plan view showing a part of a film substrate 3 on which is mounted the chip 1, and FIG. 3 is an enlarged plan view showing an area corresponding to one product (liquid crystal driver) of the film substrate 3.

The film substrate 3 is fabricated by forming plural Cu leads 5 each having a thickness of 18 to 25 μm on one surface of an insulating film (thin film base) 4, the insulating film 4 being formed by a polyimide resin and having a thickness of 40 to 50 μm. In a peripheral portion of the insulating film 4 are formed holes 6 for feeding the film, the holes 6 being formed at predetermined intervals. The actual film substrate 3 is a multi-film much longer than that shown in FIG. 2. In a liquid crystal driver manufacturing line, the film substrate 3 is conveyed in a reeled state from the initial step up to the final step.

The plural leads 5 are fabricated by vapor-depositing a copper film on the surface of the insulating film 4, followed by patterning in accordance with a photochemical etching process. The leads 5 are fixed to the surface of the insulating film 4 without interposition of any adhesive.

Figure 4:
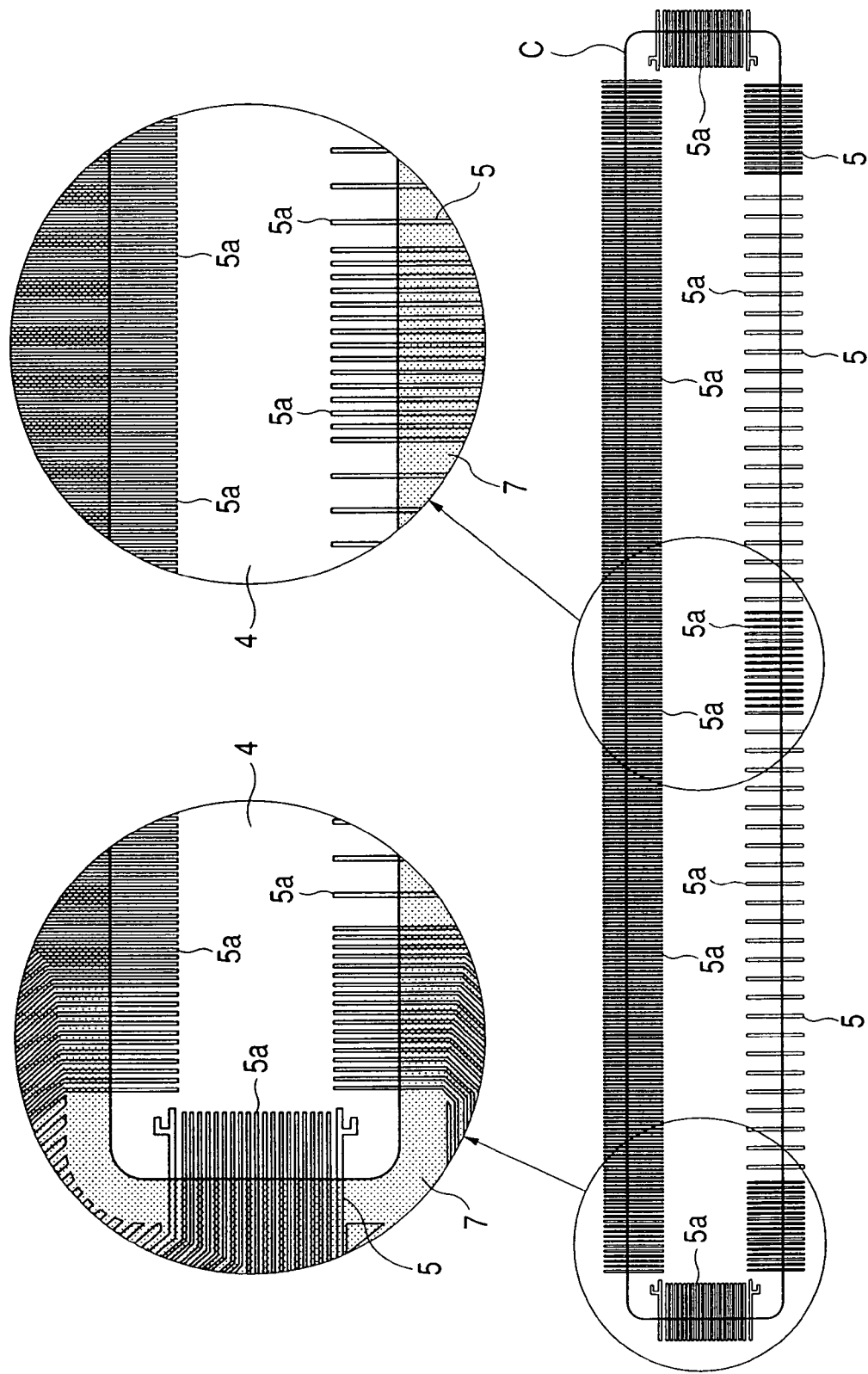
FIG. 4 is an enlarged plan view showing a chip mounting area on the film substrate illustrated in FIG. 2.

As shown in FIG. 3, an area (a chip mounting area C) for mounting the chip 1 shown in FIG. 1 is formed at an approximately central part of the film substrate 3. FIG. 4 is a plan view showing the chip mounting area C on a larger scale.

The plural leads 5 formed on the film substrate 3 are arranged in such a manner that their one ends surround the chip mounting area C, and their tip portions projecting inside the chip mounting area C constitute inner leads 5a. The surfaces of the inner leads are coated with a layer of Sn by, for example, electrolytic plating, electroless plating, vapor deposition, or sputtering.

In the chip mounting area C shown as a rectangular area in FIG. 4, the inner leads 5a are arranged along an upper long side and also along short sides located on both sides of the upper long side, constituting output-side terminals. The pitch of the inner leads 5a located near both end portions of the long side and those located on the short sides is 60 μm, while the pitch of the inner leads 5a positioned on the central portion of the long side is 44 μm. Of the inner leads 5a arranged along a lower long side of the chip mounting area C, those of a narrow pitch (60 μm) positioned near both end portions constitute output-side terminals, while those positioned centrally constitute input-side terminals. Since the number of input terminals of the liquid crystal driver is smaller than that of output terminals thereof, the inner leads 5a which constitute input-side terminals are arranged at a wider pitch than on the output side.

On the other hand, opposite ends of the plural leads 5 constitute outer leads 5b. A portion (output-side terminals) of the outer leads 5b are arranged at the left-hand end portion of the film substrate 3 shown in FIG. 3, while another portion (input-side terminals) of the outer leads 5b are arranged at the right-hand end portion of the film substrate 3 in the same figure. Solder resist 7 is formed on the surfaces of the other leads than the inner and outer leads 5a, 5b. As will be described later, in mounting the liquid crystal driver of this embodiment onto a liquid crystal substrate, the outer leads 5b are connected to electrodes on the liquid crystal substrate.

According to the structure of a film substrate which is generally employed in the manufacture of a known TAB (Tape Automated Bonding) or TCT (Tape Carrier Package), an insulating film in a chip mounting area is punched with a punching die to form a device hole and inner leads are arranged inside the device hole. In such a structure, however, the inner leads are not supported by the film, so that as the inner leads become extremely narrow in line width and pitch with an increase in the number of input/output terminals, the inner leads may be deformed or become easy to short-circuit. For this reason, in the film substrate 3 used in this embodiment, a device hole is not formed in the insulating film 4 of the chip mounting area C. That is, the leads 5 in its entirety, including inner and outer leads 5a, 5b, are fixed to the surface of the insulating film 4. According to this structure, even if the inner leads 5a are made extremely narrow in both line width and pitch, their deformation and short-circuit are prevented; besides, even after mounting of the chip 1 onto the film substrate 3, stress concentration on the inner leads 5a is mitigated, whereby the reliability of temperature cycle is improved.

But in the structure wherein the inner leads 5a are fixed to the surface of the insulating film 4, the heat of a bonding tool is apt to be transmitted to the film substrate 3 in a bonding step of the chip 1 which will be described later. Moreover, since a device hole is not provided, the heat which has been transmitted to the film substrate 3 is difficult to be radiated.

Consequently, in the chip bonding step, the insulating film 4 located near the inner leads 5a is exposed to a high temperature and expands thermally, thus causing a change in the pitch of the inner leads 5a fixed to the insulating film 4, with the result that the inner leads 5a and the Au bumps 2 of the chip 1 are not aligned with each other.

Further, in the film substrate 3 used in this embodiment, since the outer leads 5b are fixed to the surface of the insulating film 4, the insulating film 4 located near the outer leads 5b expands thermally due to heat generated at the time of connecting the outer leads to electrodes on the liquid crystal substrate, thus causing a change in the pitch of the outer leads fixed to the insulating film, with the result that the outer leads 5b and the corresponding electrodes on the liquid crystal substrate are not aligned with each other.

In this embodiment, therefore, the out-of-alignment between the inner leads 5a and the Au bumps 2 and the out-of-alignment between the outer leads 5b and the electrodes, which are caused by the aforesaid thermal expansion of the insulating film 4, are taken into account, and at the stage of designing the film substrate 3, the pitch of the inner leads 5a and that of the outer leads 5b are corrected by amounts corresponding to the above out-of-alignment quantities. The contents of this correction will be described in the following liquid crystal driver manufacturing method.

Figure 5:
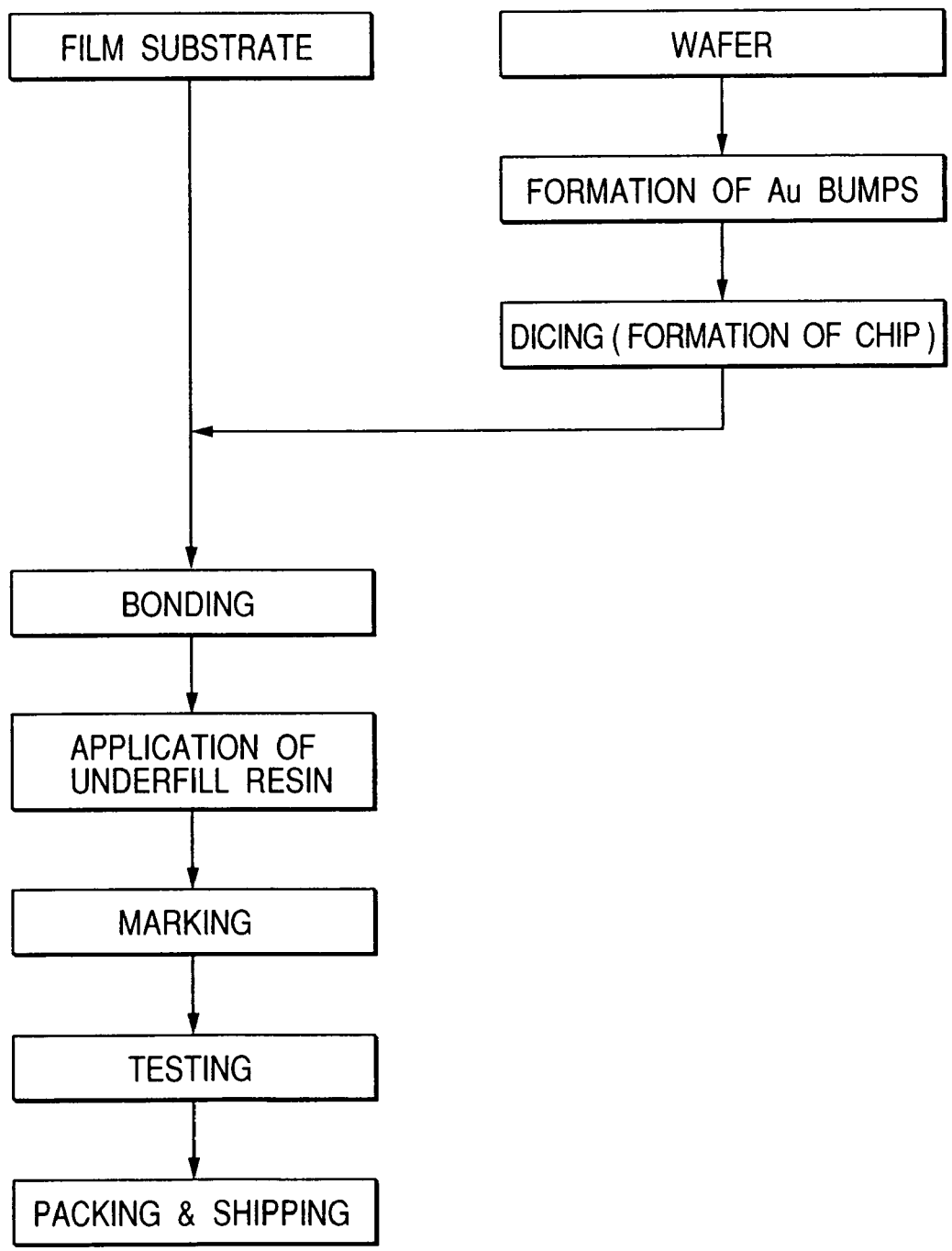
FIG. 5 is a flow chart showing a manufacturing process for the liquid crystal driver of the embodiment.

FIG. 5 is a flow chart showing a process for manufacturing the liquid crystal driver of this embodiment. For manufacturing the liquid crystal driver, first the chip 1 and the film substrate 3 are provided and the chip 1 is mounted on the film substrate 3 with use of a COF bonder.

Figure 6:
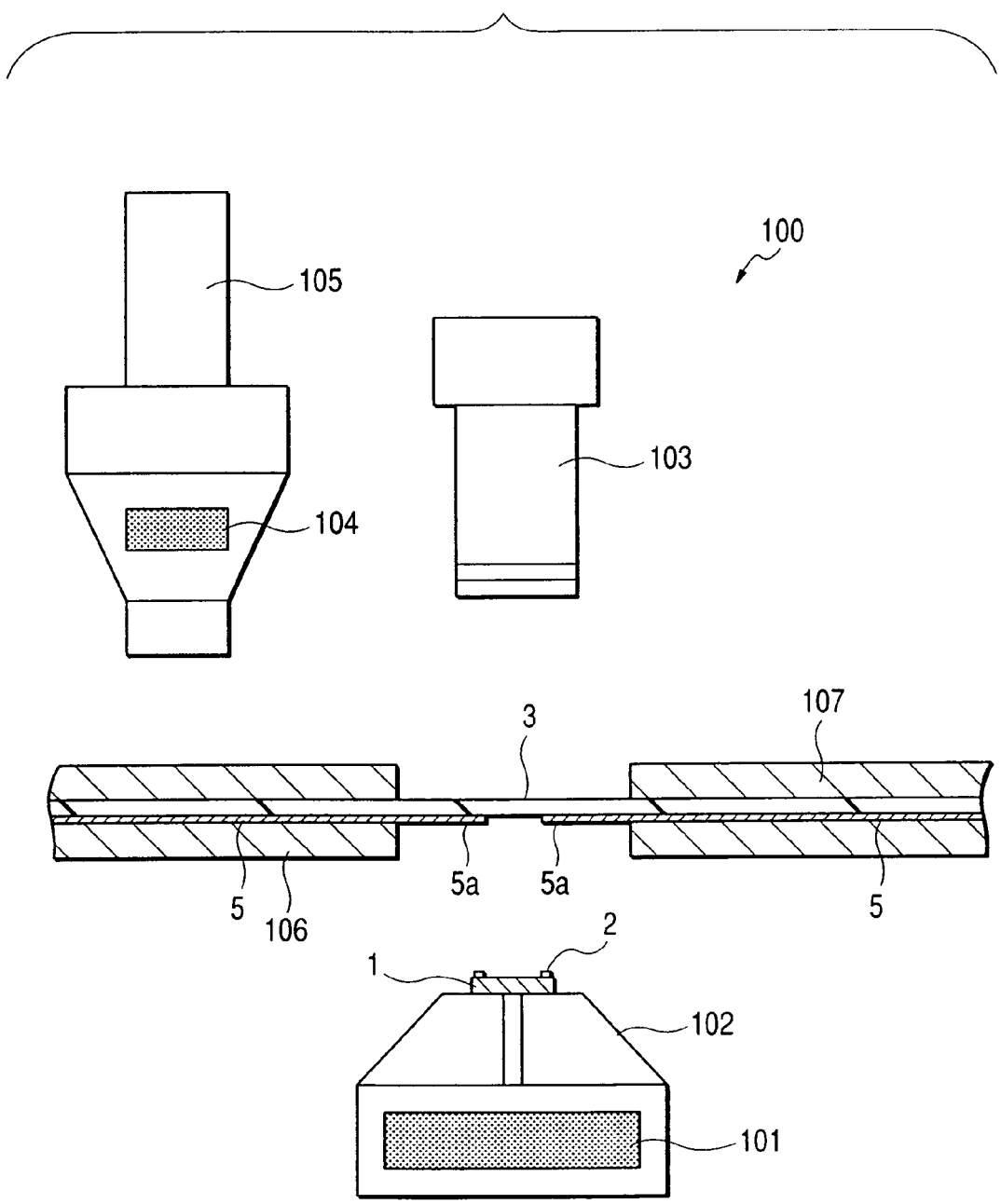
FIG. 6 is a schematic diagram showing a principal portion of a COF bonder used in manufacturing the liquid crystal driver of the embodiment.

FIG. 6 is a schematic diagram showing a principal portion of a COF bonder 100. The COF bonder 100 is provided with a stage 102 with a heater 101 incorporated therein. The chip 1 is held and fixed by vacuum chucking for example onto an upper surface of the stage 102 in a state in which its main surface faces upward. The chip 1 thus fixed is heated to 400° C. or so by the heater 101. A large number of such Au bumps 2 as shown in FIG. 1 are formed on the main surface of the chip 1. Installed above the stage 102 are a camera 103 for position recognition and a bonding tool 105 with a heater 104 incorporated therein.

Figure 7:
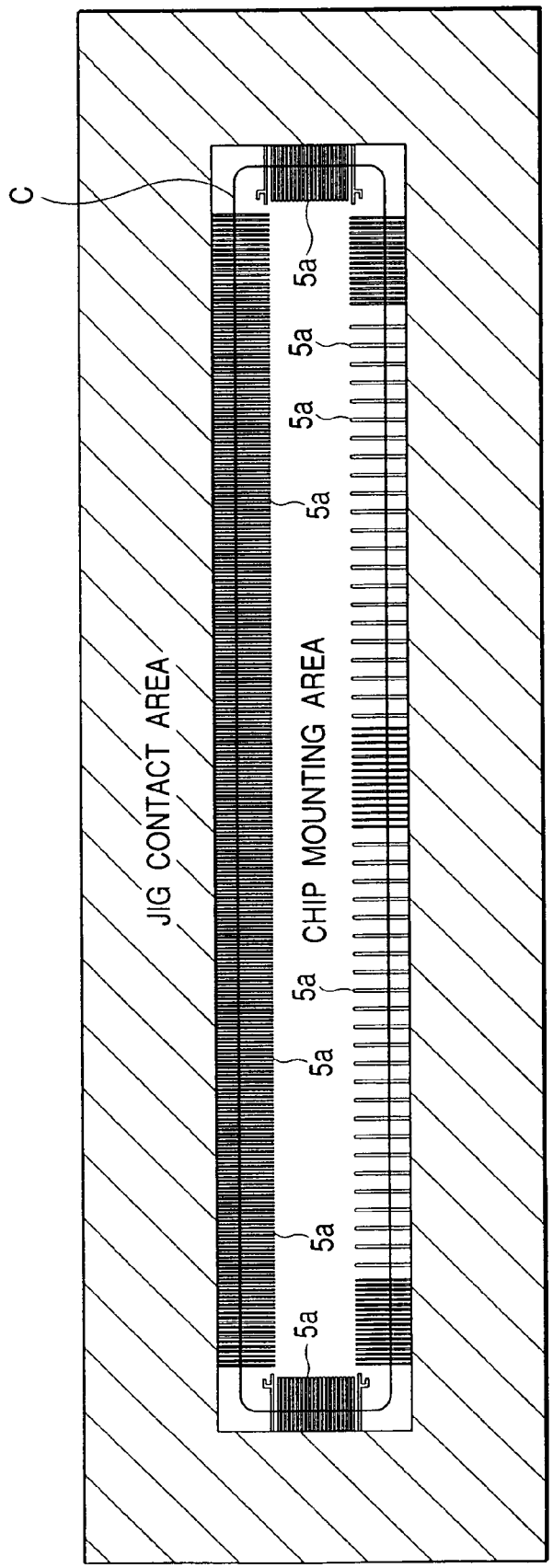
FIG. 7 is a plan view showing an area in which a damper of the COF bonder illustrated in FIG. 6 and the film substrate are brought into contact with each other.

The film substrate 3 loaded in a reeled state to the COF bonder 100 is fed from the left to the right in FIG. 5, and when the chip mounting area C has arrived at a position just above the stage102, the film substrate 3 is held and fixed from both above and below by means of a damper (jig) 106 and a guide (jig) 107. The hatched area in FIG. 7 represents an area in which the film substrate 3 and the jigs (clamper 106 and guide 107) are brought into contact with each other at the time of holding and fixing the film substrate. As shown in the figure, the jigs (clamper 106 and guide 107) hold the entire periphery of the chip mounting area C.

In this state, there is made an accurate position recognition between the Au bumps 2 of the chip 1 and the inner leads 5a of the film substrate 3, and on the basis of the result of the recognition the positions of the two are corrected accurately.

Figure 8:
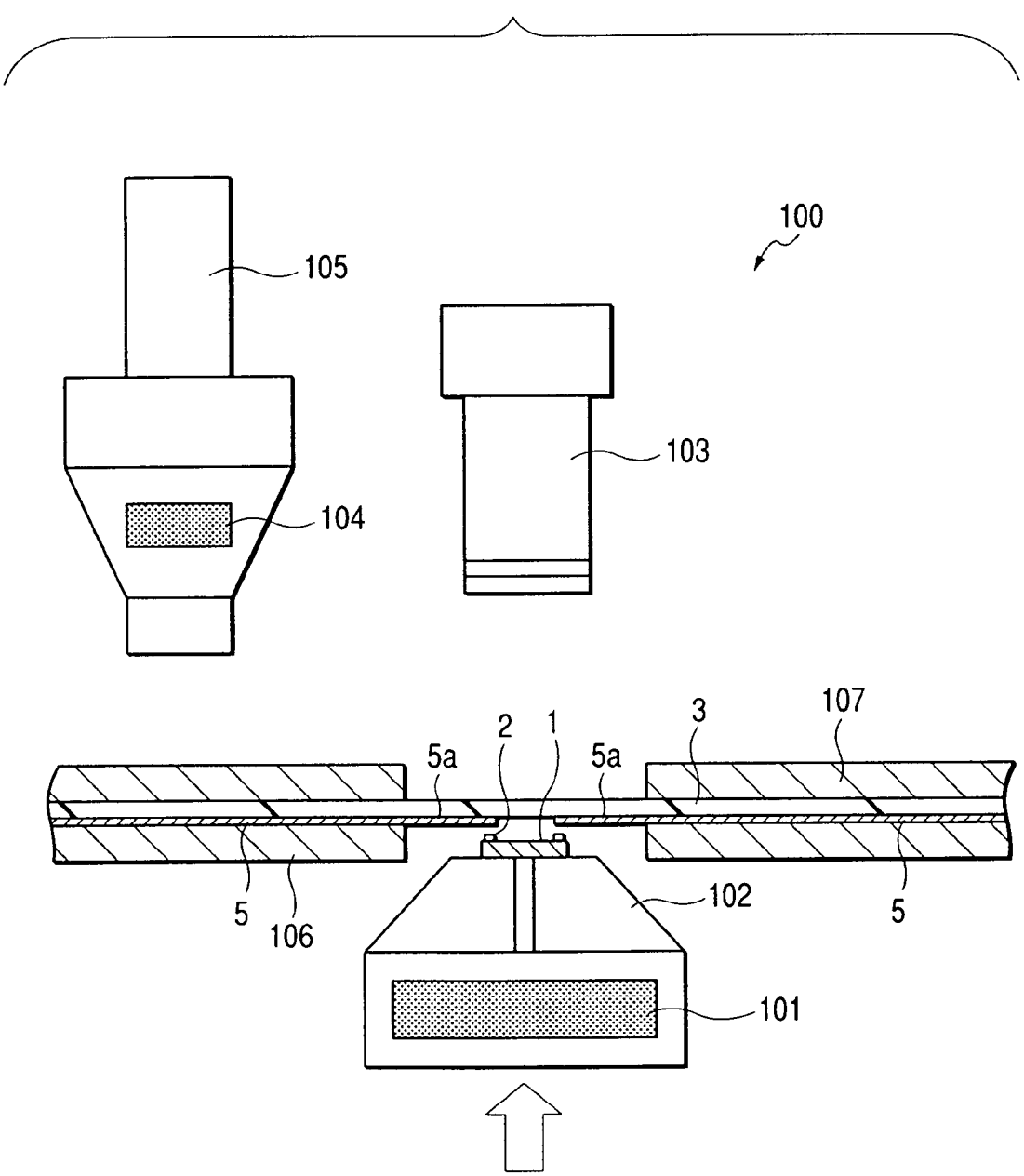
FIG. 8 is a schematic diagram showing the principal portion of the COF bonder.

Next, as shown in FIG. 8, the chip 1 is disposed (down-set) just under the film substrate 3 while leaving a space so as to avoid contact of the Au bumps 2 of the chip 1 with the inner leads 5a of the film substrate 3. The reason why the Au bumps 2 and the inner leads 5a are spaced from each other is that if both becomes into contact with each other when disposing the chip 1 just under the film substrate 3, the Au bumps 2 and the inner leads 5a whose positions have previously been corrected will be dislocated from each other.

Figure 9:
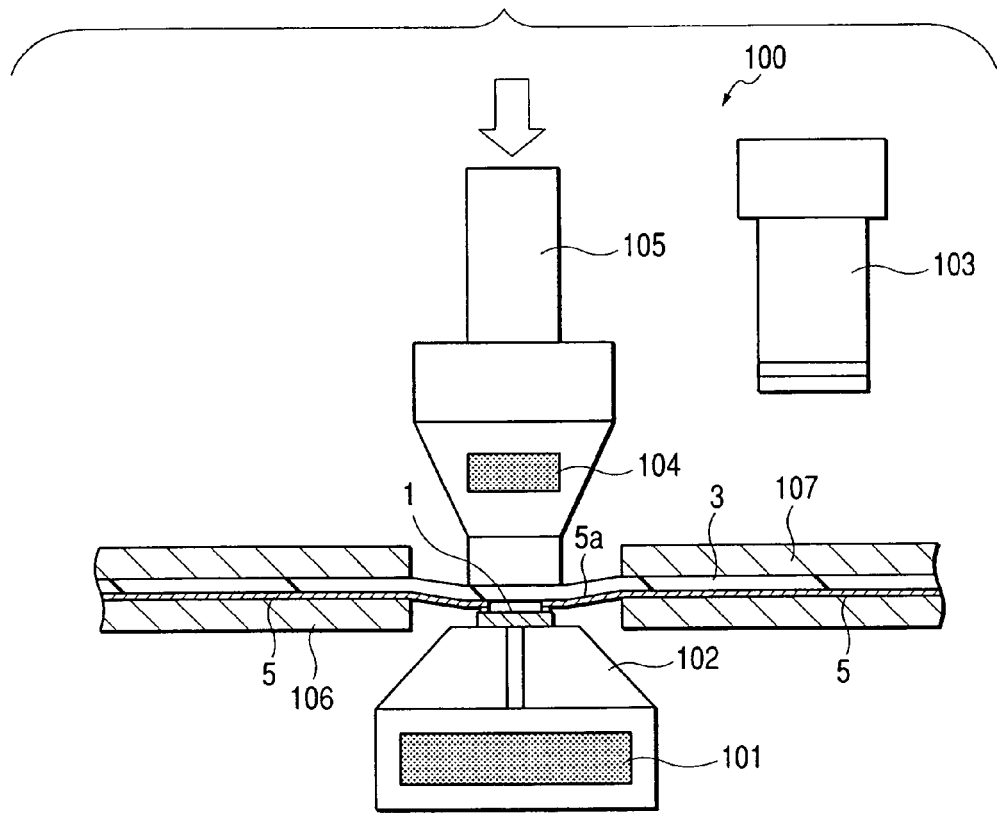
FIG. 9 is a schematic diagram showing the principal portion of the COF bonder.

Next, as shown in FIG. 9, in the down-set state of the chip 1, the bonding tool 105 is pushed against a back side (upper surface) of the film substrate 3 and the chip 1 and the film substrate 3 are sandwiched from above and below by means of the bonding tool 105 heated to about 200° C. and the stage 102 heated to about 500° C. Then, a predetermined load is applied for 2 seconds, whereby all the Au bumps 2 formed on the chip 1 and the corresponding inner leads 5a on the film substrate 3 are simultaneously connected together by Au—Sn eutectic bonding.

The reason why the bonding between the Au bumps 2 and the inner leads 5a is performed at a temperature as high as 400° C. or so is that the melting point of Au—Sn eutectic is as high as 285° C. and that therefore it is necessary to effect the bonding in a short time and at a high speed so as to avoid burning of the insulating film 4.

However, this temperature is a very high temperature for the insulating film 4 formed of a polyimide resin having a glass transition point (Tg) of about 230° C. Besides, as noted earlier, in the structure wherein the inner leads 5a are fixed to the surface of the insulating film 4, the heat of the bonding tool 105 is transmitted easily to the insulating film 4. Therefore, at the time of bonding the Au bumps 2 and the inner leads 5a, the insulating film 4 located near the inner leads 5 is exposed to the high temperature and expands thermally, with consequent change in the pitch of the inner leads 5a fixed to the insulating film 4.

Figure 10:
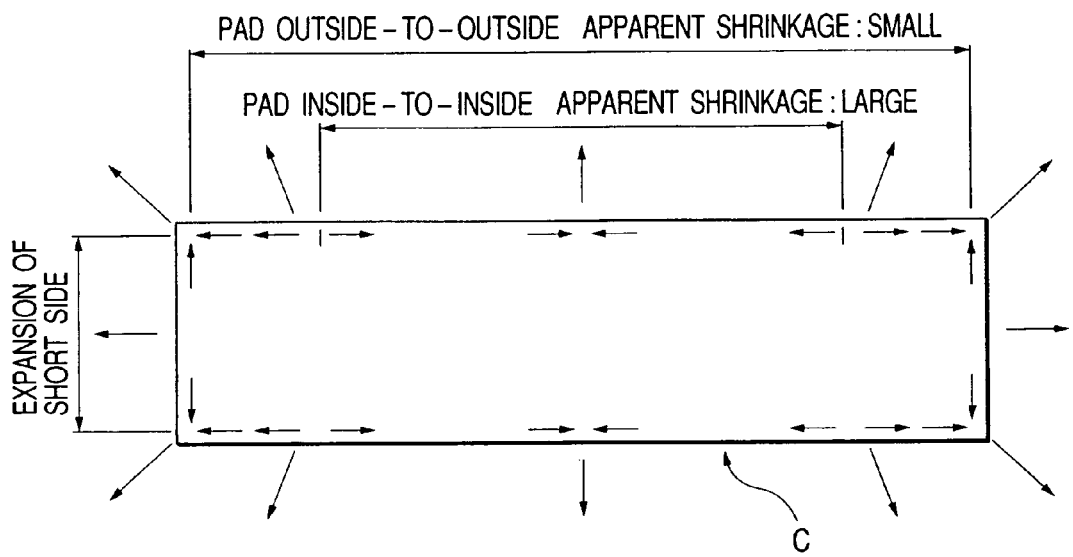
FIG. 10 is an explanatory diagram showing a thermally expanding direction of an insulating film in the chip mounting area.

In this connection, FIG. 10 indicates with arrows in which directions the insulating film 4 in the chip mounting area C expands thermally.

At the time of bonding the Au bumps 2 and the inner leads 5a, the high-temperature bonding tool 105 comes into contact with the insulating film 4 located inside the chip mounting area C, so that the insulating film tends to expand radially outwards, centered on the chip mounting area. However, since the peripheral portion of the chip mounting area C is held and fixed by the jigs (clamper 106 and guide 107) and the chip 1 is heated with the high-temperature bonding tool 105, the outward expansion of the insulating film 4 is restricted and expands toward the center of the chip mounting area C. That is, inside the chip mounting area C, the insulating film 4 appears to shrink. This apparent shrinkage quantity is maximum at the central portion of the chip mounting area C and is small near longitudinal end portions.

As a result, the pitch of the inner leads 5a becomes smaller with shrinkage of the insulating film 4 and the closer to the central portion of the chip mounting area C the inner leads 5a are located, the larger the degree of pitch reduction. According to an actual measurement made by the present inventors, a cumulative pitch reduction quantity of the inner leads 5a in the longitudinal direction of the chip mounting area C was 2 µm, while that of the inner leads 5a located near the central portion of the chip mounting area C was 5 µm.

In this embodiment, therefore, the reduction, or narrowing, of the inner lead pitch in bonding is taken into account and a (+) correction is made to the pitch of the inner leads 5a in the stage of designing the film substrate 3. More specifically, a cumulative pitch of all the inner leads 5a in the longitudinal direction of the chip mounting area C is increased by 2 µm and that of the inner leads 5a located near the central portion of the chip mounting area is further increased by 3 µm into 5 µm. As shown in FIG. 9, moreover, since the back side of the film substrate 3 is pushed with the bonding tool 105 in the down-set state of the chip 1, the insulating film 4 is pulled at positions close to the four corners of the chip mounting area C, so that the pitch of the inner leads 5a becomes wider than that before the bonding. That is, the influence caused by the insulating film 4 being pulled is greater than the influence caused by thermal expansion of the same film. Therefore, at the portions close to the four corners of the chip mounting area C where the final pitch of the inner leads 5a becomes wider than the pitch before the bonding, a (−) correction is made to the pitch of the inner leads 5a.

By so doing, when the insulating film 4 in the chip mounting area C expands with the heat applied thereto from the bonding tool 105, or shrinks in appearance, the inner leads 5a and the Au bumps 2 to be connected thereto become positionally coincident with each other at a high accuracy, so that it is possible to surely prevent the occurrence of an open defect in which the inner leads 5a and the Au bumps 2 become out of contact with each other or a short defect in which two adjacent Au bumps 2 are brought into contact with each other through one inner lead 5a.

The chips 1 obtained by dicing are thus mounted one by one onto each chip mounting area C of the film substrate 3 and thereafter, as shown in FIG. 11, a potting resin 8 is filled into the gap between the chip 1 and the film substrate 3 for the purpose of reinforcement with use of a dispenser 8 or the like. Subsequently, marking and testing are performed in accordance with the flow of FIG. 5, whereby the liquid crystal driver of this embodiment is completed. FIG. 12 is a sectional view showing a completed state of the liquid crystal driver.

Figure 13:
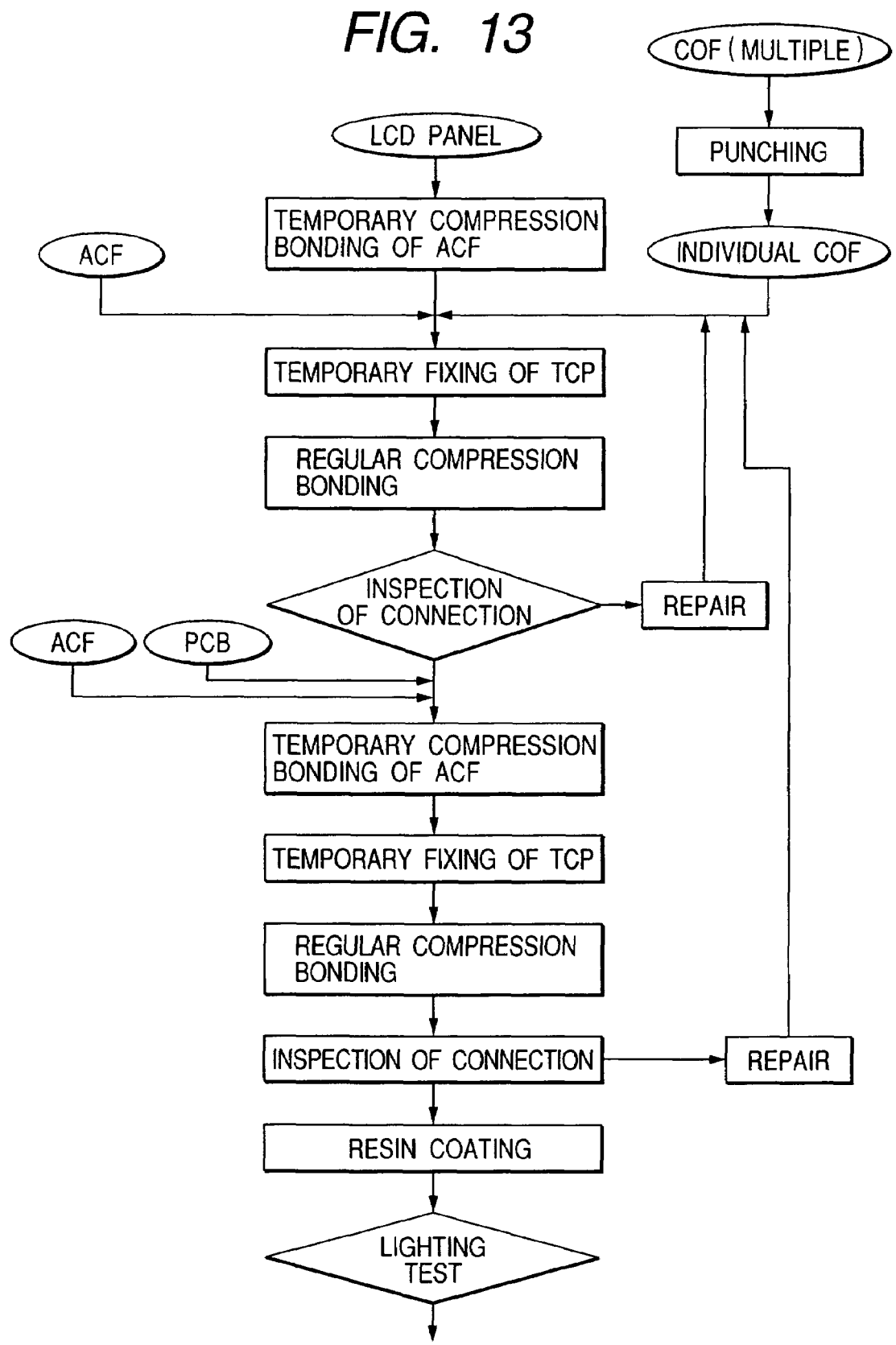
FIG. 13 is a flow chart showing a step of mounting the liquid crystal driver of the embodiment onto a liquid crystal substrate.

Next, a method of mounting the liquid crystal driver of this embodiment onto a liquid crystal substrate will be described in accordance with the flow of FIG. 13. For mounting the liquid crystal driver onto a liquid crystal substrate, first a long film substrate 3 wound up onto a reel is punched with a punching die and is thereby divided into individual film substrates 3.

Figure 14:
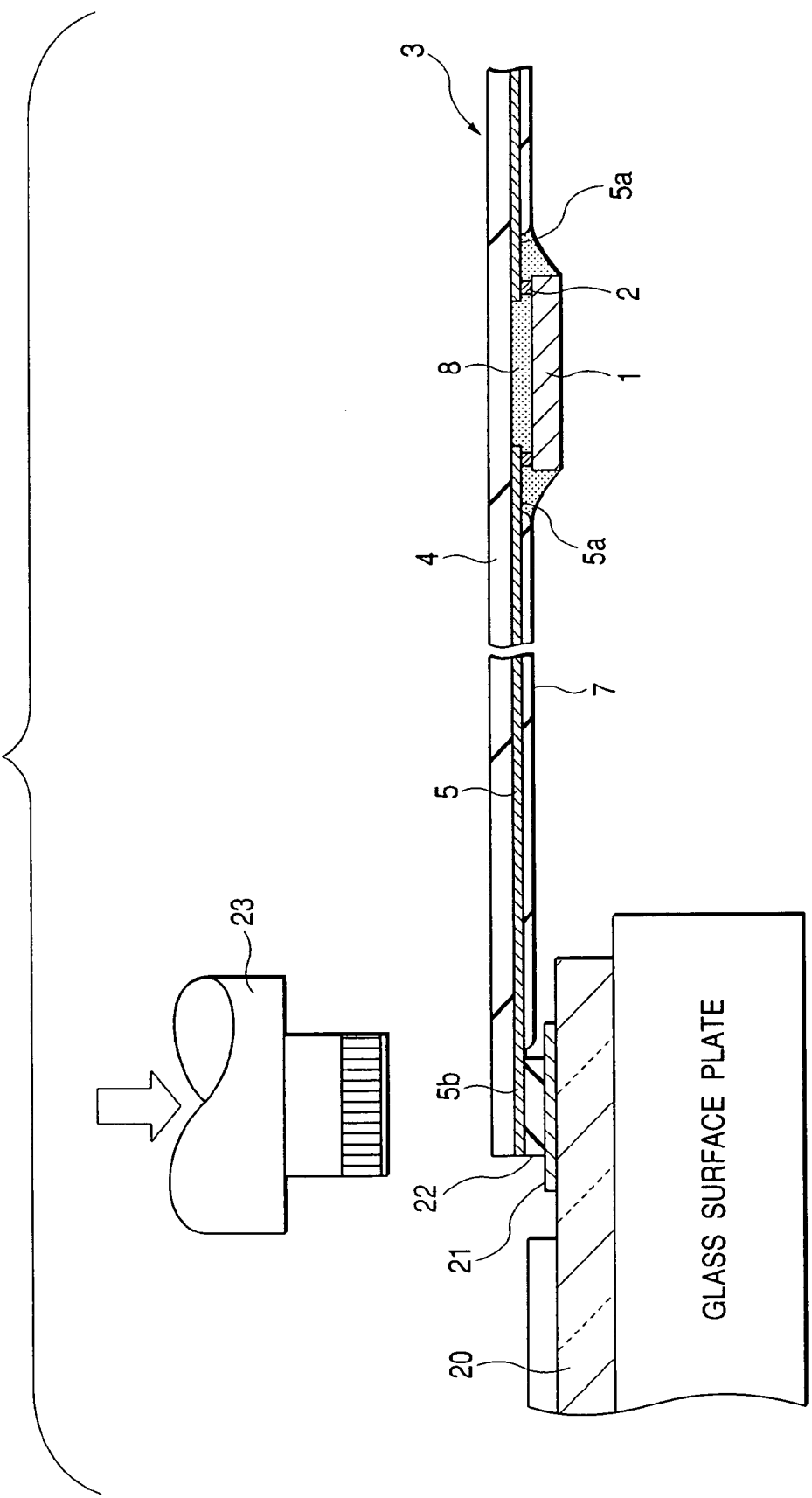
FIG. 14 is a sectional view of a principal portion, showing the step of mounting the liquid crystal driver of the embodiment onto the liquid crystal substrate.

Next, as shown in FIG. 14, each of the film substrates 3 thus obtained is positioned onto a liquid crystal substrate 20 made of glass and an anisotropic conductive resin (ACF) 22 is interposed between the outer leads 5b of the film substrate 3 and corresponding electrodes 21 formed on the liquid crystal substrate 20. In this state, a heating head 23 heated to a temperature of about 160° to 190° C. is pushed against the upper surface of the film substrate 3 to harden the anisotropic conductive resin (ACF) 22, thereby connecting the outer leads 5b and the electrodes 21 electrically with each other.

During the above bonding between the outer leads 5b and the electrodes 21, the insulating film 4 located near the outer leads 5b is exposed to a high temperature and expands thermally, with consequent change in the pitch of the outer leads 4b fixed to the insulating film 4.

Figure 15:
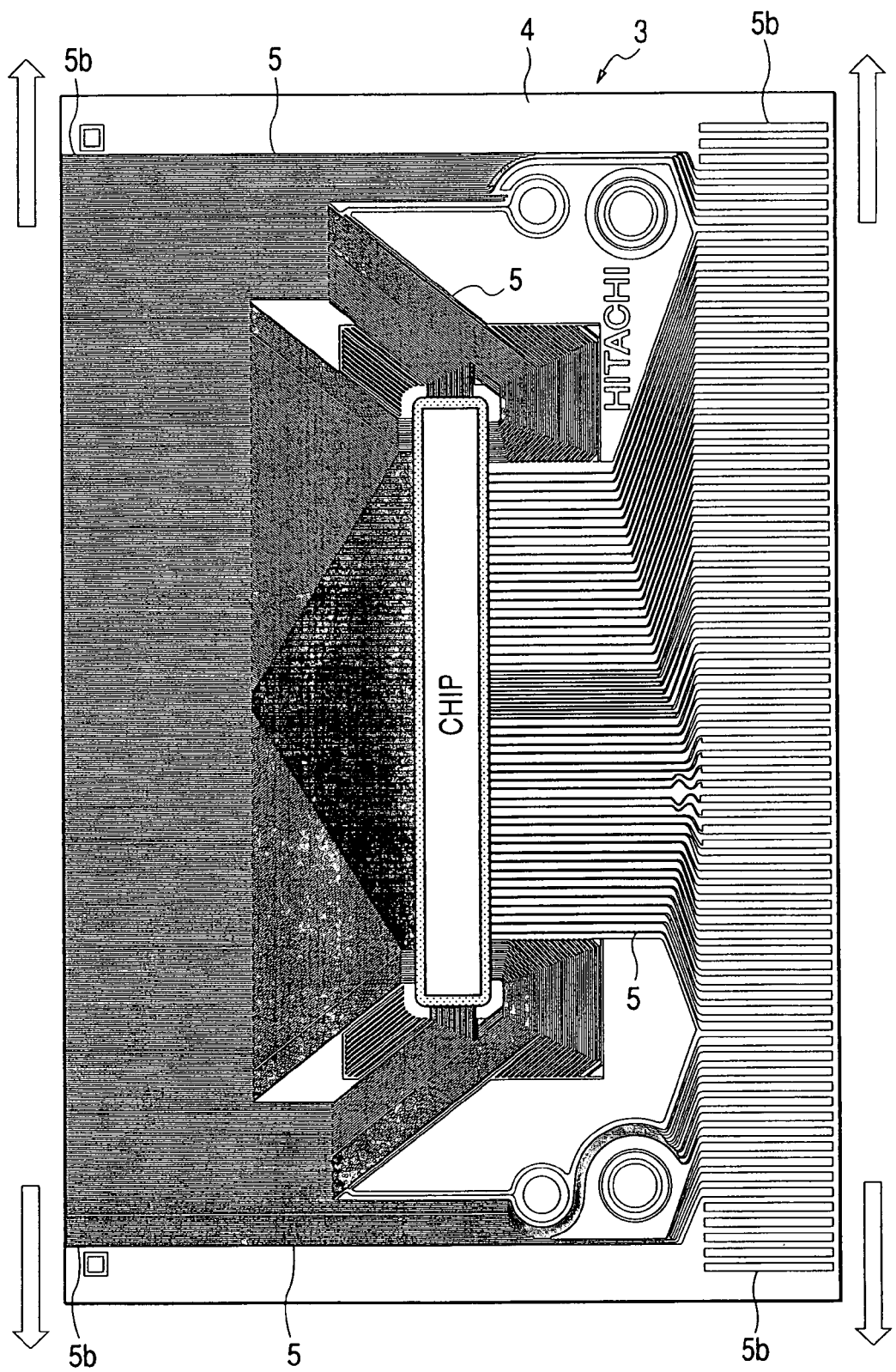
FIG. 15 is an explanatory diagram showing a thermally expanding direction of the insulating film in the vicinity of outer leads.

In this connection, FIG. 15 indicates with arrows in which directions the insulating film 4 located near the outer leads 4b expands thermally. Unlike the foregoing case of bonding between the Au bumps 2 and the inner leads 5a, the film substrate 3 is not fixed with a jig such as a clamper, so the insulating film 4 expands in the peripheral direction of the film substrate 3. As a result, the pitch of the outer leads 4b increases with the expansion of the insulating film 4.

In this embodiment, therefore, the increase of the outer lead pitch in the bonding between the outer leads 5b and the electrodes 21 is taken into account and a (−) correction is made to the pitch of the outer leads 5b at the stage of designing the film substrate 3. That is, there is made a correction for decreasing the cumulative pitch of all of the outer leads 5b.

As a result, when the insulating film 4 located near the outer leads 5b expands, the outer leads 5b and the electrodes 21 to be connected thereto become positionally coincident with each other at a high accuracy, thus permitting the outer leads 5b and the electrodes 21 to be bonded together in a positive manner.

The liquid crystal driver thus mounted on the liquid crystal substrate 20 outputs a signal from the chip 1 to turn ON or OFF a display element on the liquid crystal panel, permitting transmission of backlight or cutting off the transmission.

Although the present invention has been described by way of an embodiment thereof, it goes without saying that the invention is not limited to the above embodiment and that various changes may be made within the scope not departing from the gist of the invention.

The method for chip-leads connection is not limited to Au—Sn eutectic bonding, but there may be used Au—Au bonding for example.

The structure of the film substrate is not limited to the one with Cu leads formed on the polyimide resin film, but there may be used various film substrates each comprising a flexible, insulating thin film base and leads formed thereon, such as copper-wired glass fabric-based epoxy resin substrate, copper-wired glass polyimide substrate, copper-wired BT resin substrate, copper-wired fluorine resin substrate, and copper-wired aramid substrate.

The present invention is not limited to the liquid crystal driver, but is applicable various semiconductor devices of the type in which a chip having salient electrodes is facedown-mounted to a flexible film substrate.

The following is a brief description of the effect obtained by the typical invention disclosed herein.

Since the salient electrodes on the semiconductor chip and the leads on the wiring substrate can be aligned with each other at a high accuracy, the connection reliability of the two is improved.

What is claimed is:

1. A method of manufacturing a semiconductor device, comprising the steps of:
   (a) providing a semiconductor chip including a plurality of Au bump electrodes formed over a main surface of the semiconductor chip and having a first pitch;
   (b) providing a film substrate including an insulating film formed with a polyimide resin, a plurality of Cu leads formed over a main surface of the insulating film and having a second pitch which is larger than the first pitch, and Sn plated over a surface of each of the plurality of leads;
   (c) mounting the semiconductor chip to the main surface of the film substrate so as to contact the plurality of bump electrodes of the semiconductor chip with the plurality of leads of the film substrate, respectively; and
   (d) electrically connecting the plurality of bump electrodes with the plurality of leads, respectively, under a first temperature which is higher than a transition point of the film substrate, while clamping a peripheral portion of the film substrate using a jig.

2. The method according to claim 1, wherein a melting point of Au-Sn eutectic is higher than the transition point of the film substrate.

3. The method according to claim 2, wherein the first temperature is higher than the melting point of Au-Sn eutectic.

4. The method according to claim 1, wherein the first temperature is about 400° C., and the transition point of the film substrate is about 230° C.

5. The method according to claim 1, wherein after the step of (d), the pitch of the plurality of leads becomes less than the second pitch.

6. The method according to claim 1, wherein the insulating film of the film substrate is formed in an area opposed to the main surface of the mounted semiconductor chip.

7. The method according to claim 1, further comprising, after the step of (d), a step of injecting an underfill between the main surface of the semiconductor chip and the main surface of the film substrate.

* * * * *